United States Patent [19]
Bergemont et al.

[11] Patent Number: 5,557,567
[45] Date of Patent: Sep. 17, 1996

[54] METHOD FOR PROGRAMMING AN AMG EPROM OR FLASH MEMORY WHEN CELLS OF THE ARRAY ARE FORMED TO STORE MULTIPLE BITS OF DATA

[75] Inventors: Albert Bergemont; Min-hwa Chi, both of Palo Alto, Calif.

[73] Assignee: National Semiconductor Corp., Santa Clara, Calif.

[21] Appl. No.: 417,938

[22] Filed: Apr. 6, 1995

[51] Int. Cl.$^6$ .................................................. G11C 11/34
[52] U.S. Cl. .............................. 365/185.16; 365/185.14; 365/185.24; 365/185.27
[58] Field of Search ...................... 365/174, 185, 365/103, 185.14, 185.16, 185.24, 185.27

[56] References Cited

U.S. PATENT DOCUMENTS

| | | | |
|---|---|---|---|
| 4,181,980 | 1/1980 | McCoy | 365/45 |
| 4,279,024 | 7/1981 | Schrenk | 365/203 |
| 4,357,685 | 11/1982 | Daniele et al. | 365/189 |
| 4,698,787 | 10/1987 | Mukherjee et al. | 365/185 |
| 5,021,999 | 6/1991 | Kohda et al. | 365/168 |
| 5,043,940 | 8/1991 | Harari | 365/168 |
| 5,187,683 | 2/1993 | Gill et al. | 365/185 |
| 5,204,835 | 4/1993 | Eitan | 365/185 |
| 5,241,497 | 8/1993 | Komarek | 365/104 |
| 5,346,842 | 9/1994 | Bergemont | 437/52 |
| 5,394,362 | 2/1995 | Banks | 365/189 |
| 5,418,743 | 5/1995 | Tomioka et al. | 365/189 |
| 5,434,825 | 7/1995 | Harari | 365/185.24 |
| 5,493,527 | 2/1996 | Lo et al. | 365/185.11 |

OTHER PUBLICATIONS

T. Blyth et al., "A Non–Volatile Analog Storage Device Using EEPROM Technology", ISSCC91/Session 11/Emerging Circuit Technologies/Paper TP11.7, Feb. 14, 1991 (3 Pages).

M. Horiguchi et al., "An Experimental Large–Capacity Semiconductor File Memory Using 16–Levels/Cell Storage", IEEE Journal of Solid–State Circuits, vol. 23, No. 1, Feb. 1988, pp. 27–33.

C. Bleiker et al. "A Four–State EEPROM Using Floating–Gate Memory Cells", IEEE Journal of Solid–State Circuits, vol. SC–22, No. 3, Jun. 1987, pp. 460–463.

N. Saks et al., "Observation of Hot–Hole Injection of NMOS Transistors Using a Modified Floating–Gate Technique", U.S. Government Publication (5 pages).

K. Oyama et al., "A Novel Erasing Technology for 3.3V Flash Memory with 64Mb Capacity and Beyond", 1992 IEEE, IEDM 92, pp. 607–610.

S. Yamada et al., "A Self–Convergence Erasing Scheme for a Simple Stacked Gate Flash EEPROM", 1991 IEEE, IEDM 91, pp. 307–310.

E. Takeda et al., "Device Performance Degradation Due to Hot–Carrier Injection at Energies Below the Si–SiO$_2$ Energy Barrier", 1983 IEEE, IEDM 83, pp. 396–399.

K. R. Hofmann et al., "Hot–Electron and Hole–Emission Effects in Short n–Channel MOSFET's", IEEE Transactions on Electron Devices, vol. ED–32, No. 3, Mar. 1985, pp. 691–699.

(List continued on next page.)

Primary Examiner—David C. Nelms
Assistant Examiner—F. Niranjan
Attorney, Agent, or Firm—Limbach & Limbach L.L.P.

[57] ABSTRACT

Multiple logic levels can be simultaneously programmed into any combination of memory cells in a column of an alternate-metal virtual-ground (AMG) EPROM or flash memory array by applying one of a corresponding number of programming voltages to the word lines that correspond with the cells to be programmed. In the present invention, the memory cells in the array form a punchthrough current during programming which, in turn, leads to the formation of an increased number of substrate hot electrons. By utilizing the substrate hot electrons formed from the punchthrough current in addition to the channel hot electrons, much lower control gate voltages can be utilized during programming.

6 Claims, 7 Drawing Sheets

Y. Nissan–Cohen, "A Novel Floating–Gate Method for Measurement of Ultra–Low Hole and Electron Gate Currents in MOS Transistors", IEEE Electron Device Letters, vol. EDL–7, No. 10, Oct. 1986, pp. 561–563.

R. Bez et al., "A Novel Method for the Experimental Determination of the Coupling Ratios in Submicron EPROM and Flash EEPROM Cells", 1990 IEEE, IEDM 90, pp. 99–102.

METHOD FOR PROGRAMMING AN AMG EPROM OR FLASH MEMORY WHEN CELLS OF THE ARRAY ARE FORMED TO STORE MULTIPLE BITS OF DATA

BACKGROUND OF THE INVENTION

1. Field of the Invention

The present invention relates to programming an alternate-metal virtual-ground (AMG) EPROM or flash memory and, more particularly, to a method for programming these memories when cells of the array are formed to store multiple bits of data, i.e., more than a logic "1" and a logic "0".

2. Description of the Related Art

An alternate-metal virtual-ground (AMG) array architecture is a type of non-volatile memory architecture that is characterized by metal which only contacts every other bit line of the array. The AMG array architecture can be utilized with both U-V erasable EPROMs as well as flash memories.

FIG. 1 shows a portion of a conventional AMG array 10. As shown in FIG. 1, array 10 includes a plurality of contacted bit lines BLC, a plurality of non-contacted bit lines BLU formed so that one non-contacted bit line BLU is positioned between each pair of contacted bit lines BLC, a plurality of memory cells 12, and a plurality of access transistors 14. As shown, the contacted bit lines BLC directly contact a metal line ML, while the non-contacted bit lines BLU contact a metal line ML via one of the access transistors 14.

Memory cells 12 are arranged in columns and rows so that a predetermined number of cells 12 are formed between each pair of contacted and non-contacted bit lines BLC and BLU. Access transistors 14, on the other hand, are arranged in columns and rows so that in each row only one transistor 14 is formed between every other pair of contacted and non-contacted bit lines BLC and BLU.

Array 10 further includes a series of word lines WL1–WLn which are formed so that one word line WL is formed over each of the memory cells 12 in a row of memory cells. As is well known, the portion of the word line 18 which is formed over each memory cell 12 functions as the control gate of that memory cell. Similarly, the access transistors 14 in a row of access transistors 14 share one of four access lines AC1–AC4.

A cell in array 10 is conventionally programmed to store one bit of data by selecting the cell to be programmed, and then applying a programming voltage to the word line that corresponds to the cell to be programmed. For example, to program cell A, the contacted bit line BLC that adjoins cell A is held at an intermediate voltage Vd (approximately 5–7 V), while the contacted bit line BLC positioned on the opposite side of cell A is held at ground Vss. The remaining contacted bit lines BLC are allowed to float. In addition, access lines AC2 and AC3 are biased to the supply voltage Vcc (approximately 5 V), while access lines AC1 and AC4 are held at ground Vss. This, in turn, pulls the non-contacted bit line BLU that contacts cell A down to ground Vss.

The programming voltage Vpp (approximately 12 V) is then applied to word line WL1, while the remaining word lines WL2–WLn are grounded. These bias conditions result in current flow as shown by the arrow in FIG. 1, which results in electron injection from the drain of cell A to the floating gate of cell A, thus programming cell A.

One drawback to programming memory cells 12 as described above is that only one bit of data can be programmed into a cell, and only one cell in a column of cells can be programmed at any one time. Although it would appear that multiple cells in a column could be simultaneously programmed by applying the programming voltage Vpp to the word lines WL2–WLn that correspond to each cell in the column to be programmed, the high current requirements of each cell during programming (approximately 400 mA) preclude this. Thus, there is a need for a method of programming multiple cells in a column of an AMG array at the same time.

SUMMARY OF THE INVENTION

The present invention provides a method for simultaneously programming any combination of memory cells in a column of cells in an alternate-metal virtual-ground (AMG) EPROM or flash memory to each store one of three or more threshold voltages, i.e., logic levels. As a result, rather than storing either a logic "1" or a logic "0", any combination of memory cells in a column can be simultaneously programmed to store, for example, a logic "0-0", a "0-1", a "1-0", or a "1-1".

In the present invention, the array, which is formed in a well, includes a plurality of metal contacted bit lines, and a plurality of non-contacted bit lines which are formed so that one non-contacted bit line is formed between each adjacent pair of metal contacted bit lines. The array also includes a plurality of memory cells which are formed in columns and rows so that each column of memory cells is formed between and contacts adjacent pairs of metal contacted and non-contacted bit lines. A plurality of access transistors are also formed in columns and rows so that one access transistor is formed at each end of each column of memory cells. In addition, each row of access transistors is formed so that one access transistor is formed between and contacts every other pair of metal contacted and non-contacted bit lines. The array further includes a plurality of access lines and a plurality of word line. The access lines are formed so that each row of access transistors is contacted by a corresponding access line, while the of word lines are formed so that each row of memory cells is contacted by a corresponding word line. In addition, each cell is formed to produce a punchthrough current during programming.

A method for simultaneously programming any combination of memory cells in a column to each store one of three or more threshold voltages includes the step of selecting a programming voltage from three or more programming voltages for each of a plurality of cells in a column that are to be programmed. In the present invention, the three or more programming voltages correspond to the three or more threshold voltages. In addition, each cell in the column that is to be programmed has a corresponding word line.

The method continues with the step of applying a first voltage to a first metal contacted bit line. The first metal contacted bit line contacts each memory cell and each access transistor in a first column of a pair of adjacent columns where the first column includes the cells to be programmed. In addition to the first voltage, a second voltage, which is less than the first voltage, is applied to a second metal contacted bit line. The second metal contacted bit line contacts each memory cell and access transistor in a second column of the pair of adjacent columns. The second voltage is also applied to the well.

The method further continues with the step of applying a third voltage to a pair of access lines where each access line of the pair of access lines contacts an access transistor located in the second column of the pair of adjacent columns. Each cell is programmed to store one of the multiple logic levels by applying the programming voltages selected for the cells to be programmed to the word lines that correspond to the cells to be programmed.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
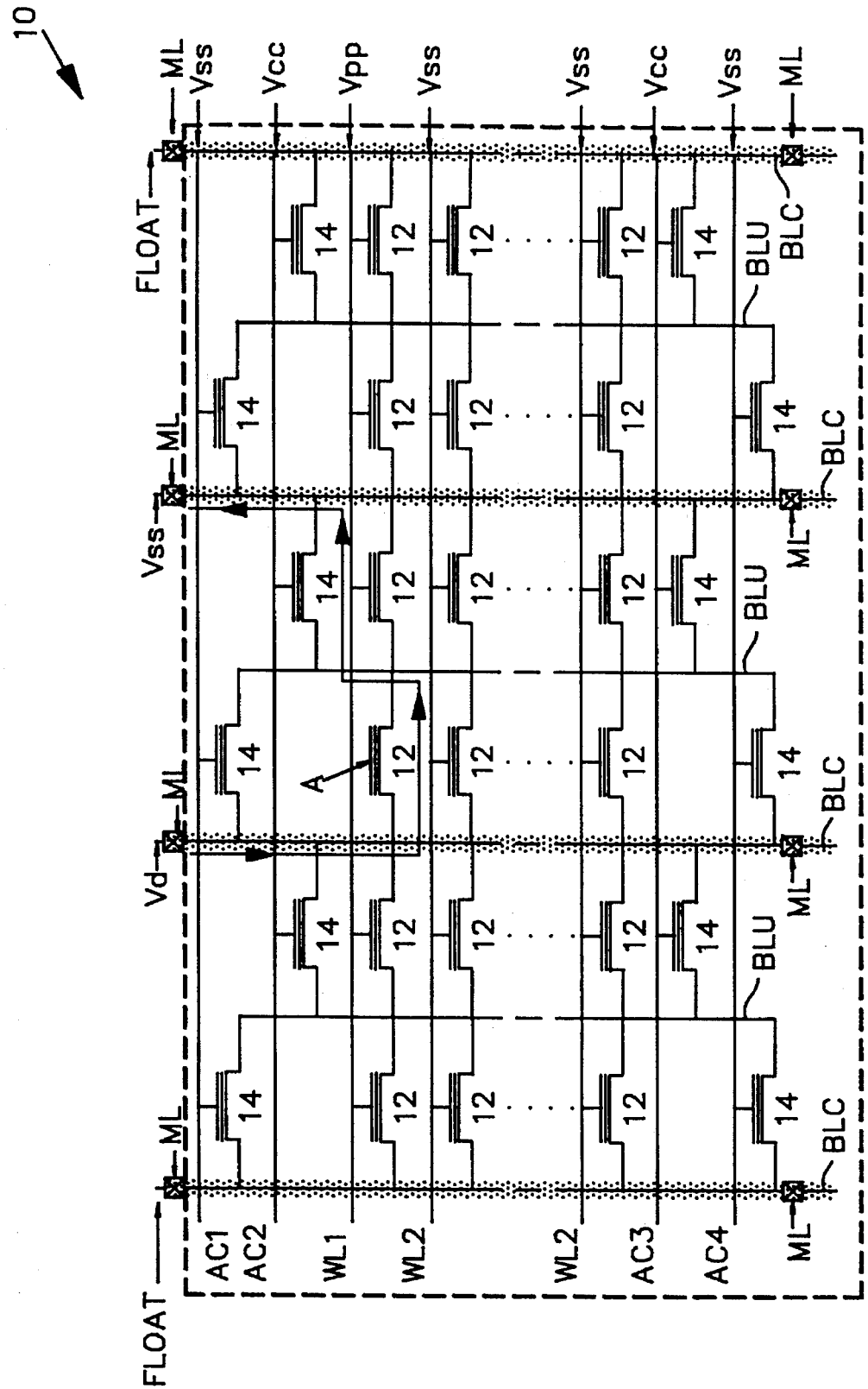
FIG. 1 is a plan view illustrating a portion of a conventional AMG array 10.
Figure 2:
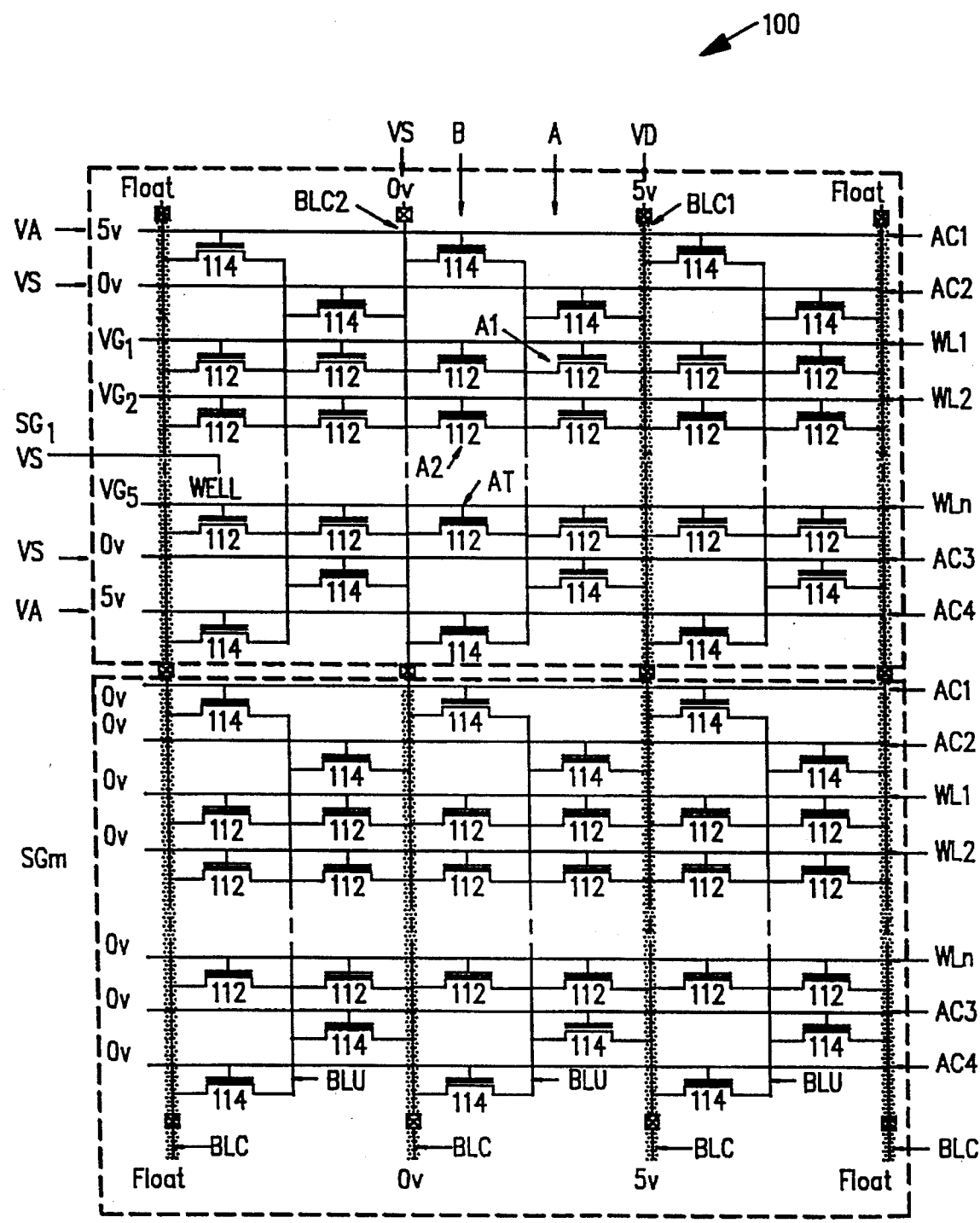
FIG. 2 is a plan view illustrating a portion of an alternate-metal virtual-ground (AMG) array 100 in accordance with the present invention.

FIG. 2 shows a portion of an alternate-metal virtual-ground (AMG) array 100 in accordance with the present invention. As shown in FIG. 2, array 100, which can be utilized with both U-V erasable EPROMs as well as flash memories, is divided into a series of segments SG1–SGm which each include a plurality of metal contacted bit lines BLC, and a plurality of non-contacted bit lines BLU which are formed so that one non-contacted bit line BLU is formed between each adjacent pair of metal contacted bit lines BLC.

Each segment SG also includes a plurality of memory cells 112 and a plurality of access transistors 114. The memory cells 112 are formed in columns and rows so that each column of memory cells 112 is formed between and contacts adjacent pairs of metal contacted and non-contacted bit lines BLC and BLU. The access transistors 114 are formed in columns and rows so that one access transistor 114 is formed at each end of each column of memory cells 112 in each segment SG. In addition, each row of access transistors 114 is formed so that one access transistor 114 is formed between and contacts every other pair of metal contacted and non-contacted bit lines BLC and BLU.

Further, each of the memory cells 112 in a row of cells 112 in a segment SG share one of a series of word lines WL1–WLn while each of the access transistors 114 in a row of transistors 114 share one of a series of access lines AC1–AC4. As is well known, the portion of the word line WL formed over each memory cell 112 functions as the control gate of that memory cell while the portion of the access line AC formed over each transistor 114 functions as the gate of that transistor.

Figure 3:
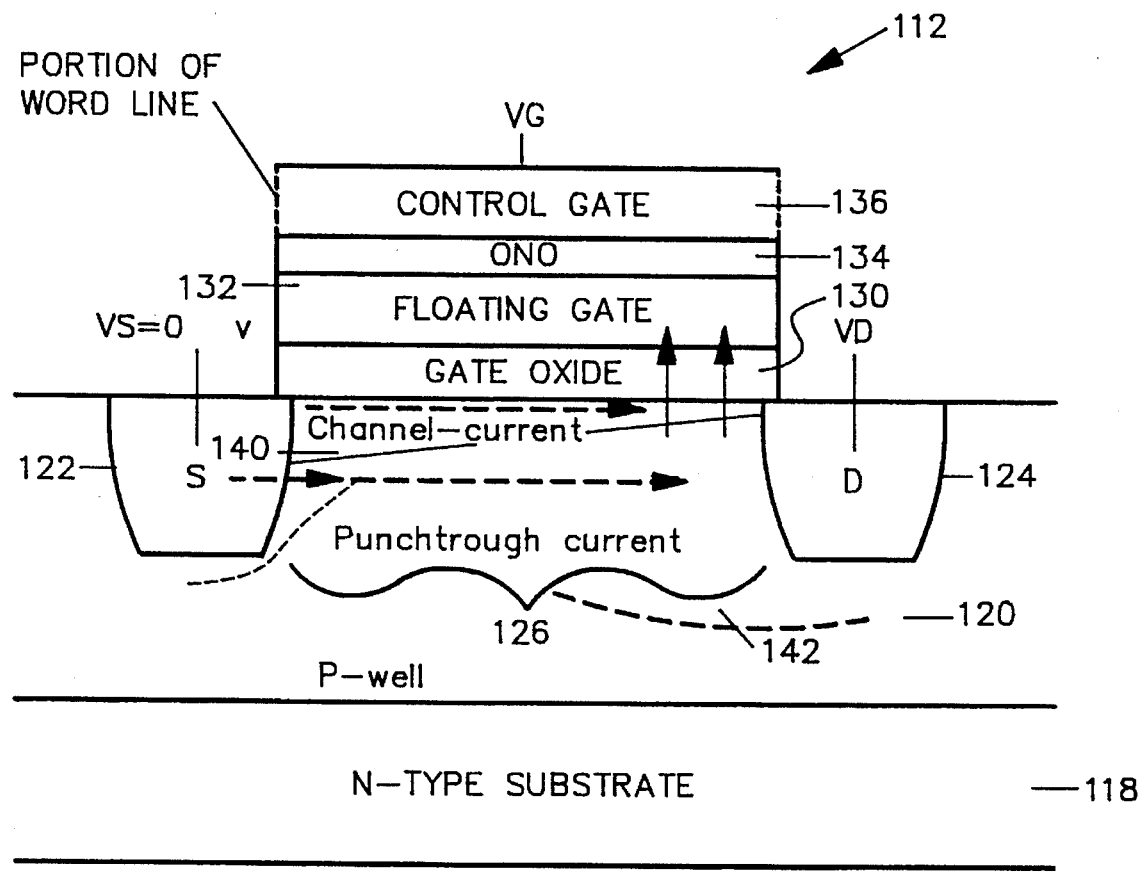
FIG. 3 is a cross-sectional view illustrating the structure of one of the memory cells 112 from array 100.

FIG. 3 shows the structure of one of the memory cells 112 from array 100. As shown in FIG. 3, cell 112 is formed in a p-type well 120 which, in turn, is formed in an n-type substrate 118. Memory cell 112 includes an n-type source region 122, an n-type drain region 124, and a channel region 126 formed between the source and drain regions 122 and 124.

In accordance with the present invention, cell 112 is formed to produce a punchthrough current during programming. The channel lengths and doping levels, as well as the bias conditions, which are required to produce a punchthrough current through channel region 126 are well known in the art.

With 0.6 micron technology, for example, cell 112 preferably utilizes a channel length of 0.5–0.7 microns and a doping concentration of $1$–$2 \times 10^{17}$ p-type atoms. When smaller micron technologies are utilized, the channel length and the doping concentration can be reduced accordingly. Thus, for example, with 0.3 micron technology, cell 112 preferably utilizes a channel length of 0.2–0.4 microns and a doping concentration of $5 \times 10^{17}$ p-type atoms.

As further shown in FIG. 3, memory cell 112 also includes a first insulation layer 130 formed over channel region 126, a floating gate 132 formed over insulation layer 130, a second insulation layer 134 formed over floating gate 132, and a control gate 136 (a portion of word line WL) formed over insulation layer 134.

In accordance with the present invention, memory cell 112 is programmed to store one of three or more logic levels by maintaining an equilibrium across the source-to-well junction, reverse-biasing the drain-to-well junction, and applying one of a corresponding three or more programming voltages to control gate 136 during programming.

With 0.6 micron technology, memory cell 112 preferably utilizes a drain voltage that is 4–7 volts greater than the well voltage. In addition, although other voltages can be utilized, well 120 and source 122 are preferably grounded.

As above, when smaller micron technologies are utilized, the preferred conditions can be reduced accordingly. Thus, for example, with 0.3 micron technology, cell 112 preferably utilizes a drain voltage which is 2–4 volts greater than the well voltage.

In operation, when one of the programming voltages is applied to control gate 136, a positive potential is induced on floating gate 132 which, in turn, attracts electrons from the doped p-type atoms in channel region 126 to the surface of well 120 to form a channel 140. This potential also repels holes from the doped impurity atoms and forms a depletion region 142.

When the source and drain voltages are applied, an electric field is established between the source and drain regions 122 and 124. The electric field, as with conventional programming, accelerates the electrons in channel 140 which, in turn, have ionizing collisions that form channel hot electrons. The positive potential on floating gate 132 attracts these channel hot electrons which penetrate insulation layer 130 and begin accumulating on floating gate 132.

In addition to the formation of channel hot electrons, the present invention utilizes the punchthrough current to form substrate hot electrons which also collect on floating gate 132. In operation, due to the relatively short channel length, i.e., 0.5 microns in a 0.6 micron process, the electric field reduces the potential energy barrier at the source-to-well junction. The reduced potential energy barrier allows more majority carriers in source 122 to overcome the barrier which, in turn, produces the punchthrough current across the source-to-well junction.

As the electrons associated with the punchthrough current near drain 124, the electric field accelerates the electrons which, in turn, also have ionizing collisions that form substrate hot electrons. The positive potential on floating gate 132 also attracts these substrate hot electrons which penetrate insulation layer 130 and begin accumulating on floating gate 132.

However, unlike conventional floating-gate programming, the flow of electrons generated by the punchthrough current does not depend on the existence of a channel or the relative positive charge on floating gate 132. As a result, the electrons associated with the punchthrough current continue to accumulate on floating gate 132 after channel 130 has been turned off.

Thus, cell 112 is programmed by utilizing both channel hot electrons and substrate hot electrons to change the potential on floating gate 132. As a result of utilizing two sources of hot electrons, a significantly lower control gate voltage can be used during programming than is conventionally used to program a cell because fewer channel hot electrons need to be attracted to floating gate 132.

Figure 4:
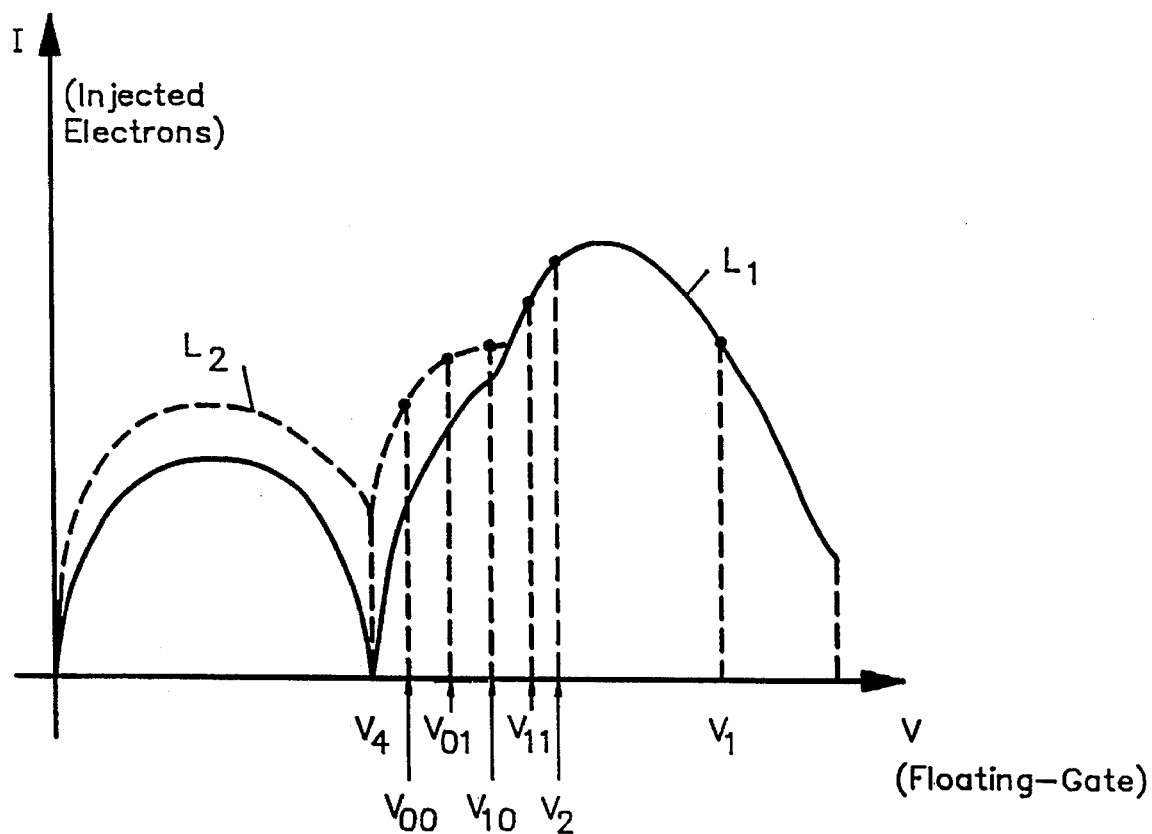
FIG. 4 is a graphical representation illustrating a cell programming characterization curve.

FIG. 4 shows a graphical representation that illustrates a cell programming characterization curve. As shown by lines $L_1$ and $L_2$ in FIG. 4, the voltage (V) on the floating gate influences the number of hot electrons (I) that are injected onto the floating gate.

Conventionally, the primary consideration in programming memory cells is the time required to place a defined amount of negative charge on the floating gate of the cell. As a result, the typical memory cell is designed to utilize an initial floating gate voltage $V_1$ and a final floating gate voltage $V_2$ that are positioned on opposite sides of the peak of the curve shown in FIG. 4, thereby taking advantage of the maximum injection of hot electrons onto the floating gate. As described, the initial floating gate voltage $V_1$ represents the voltage capacitively coupled to the floating gate from the control gate, while the final floating gate voltage $V_2$ represents the initial voltage $V_1$ reduced by the accumulated negative charge.

Figure 5:
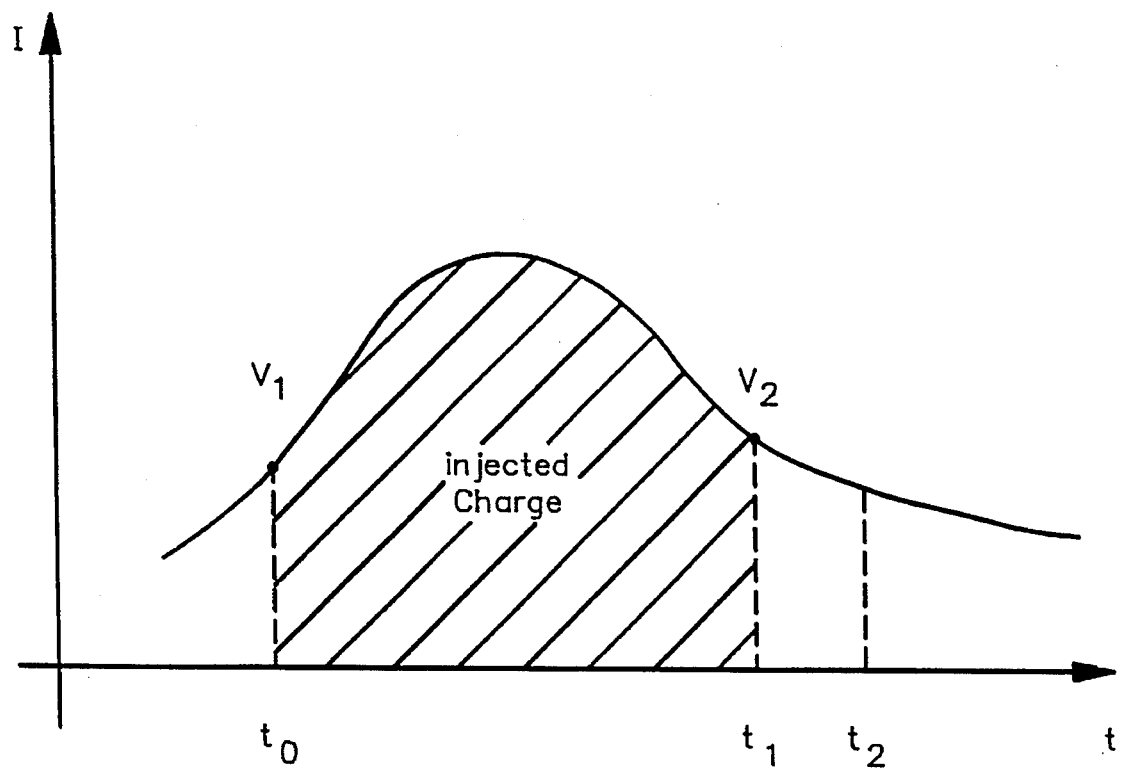
FIG. 5 is a graphical representation illustrating the amount of negative charge injected onto the floating gate for initial and final voltages $V_1$ and $V_2$.

FIG. 5 shows a graphical representation that illustrates the amount of negative charge injected onto the floating gate for initial and final voltages $V_1$ and $V_2$. As shown in FIG. 5, the amount of charge injected on the floating gate can be determined by integrating under the curve from the initial voltage $V_1$ at time $t_0$ to the final voltage $V_2$ at time $t_1$.

More importantly, however, FIG. 5 illustrates that any variation in the timing will cause a greater or lesser amount of negative charge to be injected onto the floating gate. Thus, for example, if the programming is terminated at time $t_2$ rather than time $t_1$, a greater amount of charge will be injected.

With conventional programming, this additional (or lesser) amount of negative charge does not present any problems because the cell is only being programmed to one of two logic levels. Thus, as long as the cell is programmed to have a minimum amount of charge, any additional charge is acceptable.

However, with multi-level programming, the accumulation of additional negative charge makes it difficult to determine which logic level is represented by the charge. Thus, to insure that the charge is within a defined range, the timing must be precisely controlled. This timing, however, is very difficult to control.

The present invention achieves multiple levels of injected charge by utilizing one of a plurality of initial voltages. Since the initial voltages are defined by the voltage capacitively coupled to the floating gate from the control gate, the initial voltages are selected by selecting one of a plurality of control voltages.

For example, referring again to FIG. 4, voltage $V_{00}$, $V_{01}$, $V_{10}$, or $V_{11}$ may be selected as the initial voltage by selecting a corresponding control gate voltage. As further shown in FIG. 4, the present invention utilizes voltage $V_4$ as the final voltage. The significance of utilizing voltage $V_4$ as the final voltage can be seen in FIG. 6.

Figure 6:
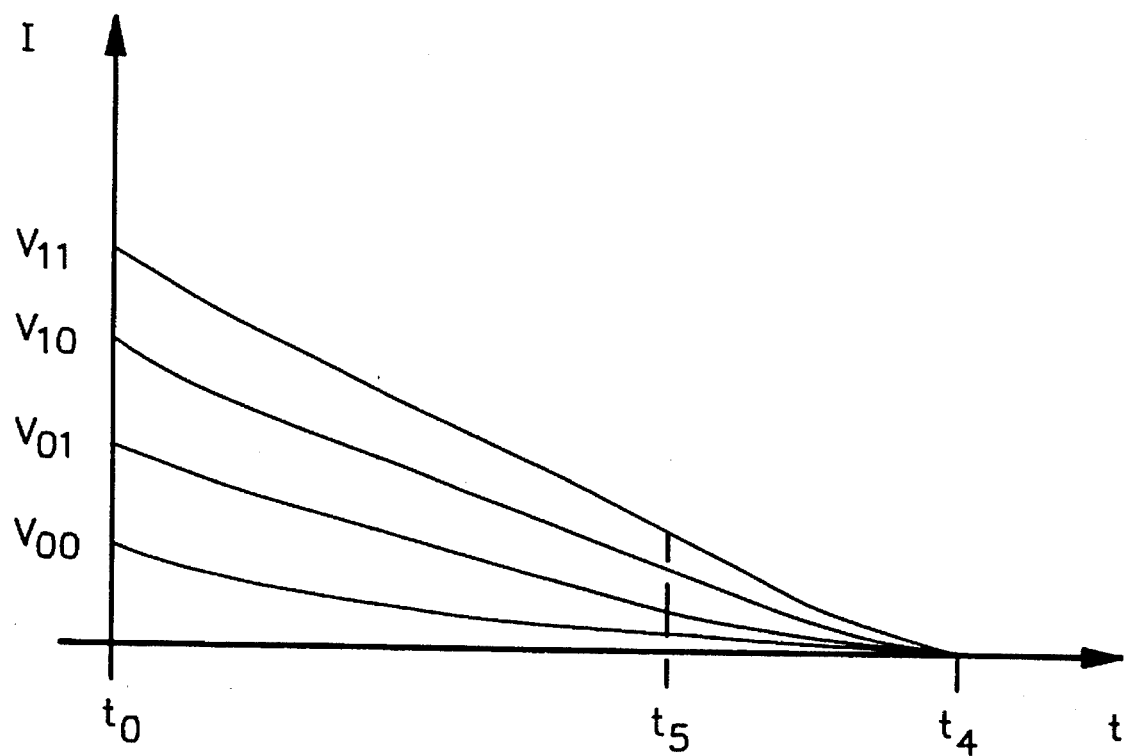
FIG. 6 is a graphical representation illustrating the amount of negative charge injected onto the floating gate for initial voltages $V_{00}$–$V_{11}$ and final voltage $V_4$.

FIG. 6 shows a graphical representation that illustrates the amount of negative charge injected onto the floating gate for initial voltages $V_{00}$–$V_{11}$ and final voltage $V_4$. As shown in FIG. 6, the amount of negative charge injected on the floating gate can be determined by integrating under the curve from each of the initial voltages $V_{00}$–$V_{11}$ at time $t_0$ to the final voltage $V_4$ at time $t_4$.

FIG. 6, however, also illustrates that because the injected charge converges towards zero for each initial voltage $V_{00}$–$V_{11}$, the injected charge is largely insensitive to timing variations. Thus, the floating gate can still have one of a plurality of discrete levels of injected charge if programming is terminated anytime between time $t_4$ and $t_5$ because the amount of additional charge during this time is so small.

One drawback of the approach, as described, is that the magnitude of the injected current drops as the voltage on the floating gate approaches the final voltage $V_4$ (see FIG. 4). As a result, it takes a greater amount of time to program the cell.

In accordance with the present invention, however, line L1 of FIG. 4 can be altered, as shown by line L2, by increasing the formation of substrate hot electrons as described above. Thus, although the time required to program a memory cell in accordance with the present invention remains longer than conventional programming, the formation of substrate hot electrons substantially narrows the time difference.

Figure 7:
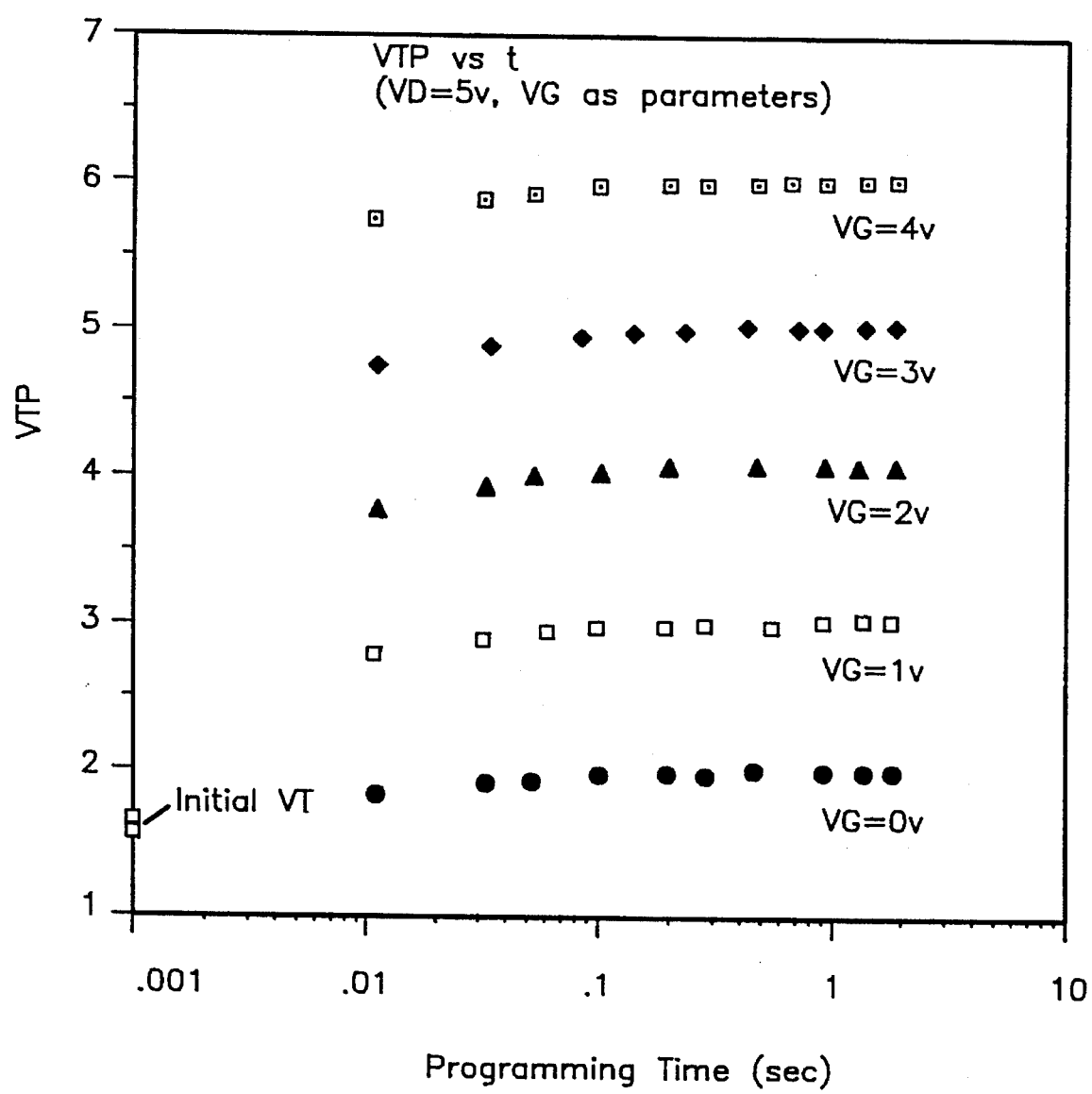
FIG. 7 is a graphical representation illustrating a series of experimental results.

FIG. 7 shows a graphical representation that illustrates a series of experimental results. As shown in FIG. 7, when one volt was applied to the control gate, the charge on the floating gate converged to a threshold voltage of approximately three volts from an initial threshold voltage of 1.5 volts within 50 milliseconds or less. Similarly, when two, three, and four volts were applied to the control gate, the charge on the floating gate converged to threshold voltages of approximately four, five, and six volts, respectively, within 50 milliseconds or less. Although an initial threshold voltage of 1.5 volts was utilized in the above experiment, any initial threshold voltage after erase may be utilized.

Since the charge on the floating gate converges to a stable value which corresponds to a defined threshold voltage within 50 milliseconds or less, a single floating gate memory cell can be programmed to have one of a plurality of threshold voltages by applying the corresponding voltage to the control gate during programming. As a result, a single floating gate memory cell can be utilized to store two or more bits of data.

For example, a 0-0 could be represented by a threshold voltage of 3 volts, while a 0-1 could be represented by a threshold voltage of 4 volts. Similarly, a 1-0 could be represented by a threshold voltage of 5 volts, while a 1-1 could be represented by a threshold voltage of 6 volts.

As further shown in FIG. 7, the experimental results also show that changes in the control gate voltage are linearly related to changes in the threshold voltage, i.e., a one volt increase in the control gate voltage increases the threshold voltage by one volt. As a result, memory cell 112 is not limited to representing two bits, but can represent any number of bits depending on the sensitivity of the current sense detectors utilized to discriminate one threshold voltage from another. Furthermore, even a continuous analog level can be stored in a cell as a threshold voltage.

For example, a 0-0-0 could be represented by a threshold voltage of 3 volts, while a 0-0-1 could be represented by a threshold voltage of 3.5 volts. Similarly, a 0-0-0-0 could be represented by a threshold voltage of 3 volts, while a 0-0-0-1 could be represented by a threshold voltage of 3.25 volts.

Thus, as described above, when an equilibrium condition is maintained across the source-to-well junction, and the drain-to-well junction is reverse-biased, cell 112 can be programmed to store three or more logic levels by applying one of a corresponding three or more programming voltages to the control gate (word line).

The equilibrium and reverse-bias conditions for the cells to be programmed are established in array 100 by identifying the column of cells to be programmed, and applying a voltage VD to the metal contacted bit line BLC that contacts the memory cells 112 and access transistors 114 in that column.

For example, referring again to FIG. 2, if any combination of cells in column A are to be programmed, voltage VD is applied to metal contacted bit line BLC1. The application of voltage VD to metal contacted bit line BLC1 is equivalent to applying a voltage to the drain of an individual cell as described above.

In addition to voltage VD, a voltage VS, which is less than voltage VD, is applied to the metal contacted bit line BLC that contacts the memory cells 112 and access transistors 114 in a column adjacent to the column containing the cells to be programmed. The remaining metal contacted bit lines BLC are allowed to float.

Thus, continuing the above example, since column B is the only column adjacent to column A which contacts one of the metal contacted bit lines BLC, voltage VS is applied to metal contacted bit line BLC2. The application of voltage VS to metal contacted bit line BLC2 is, as a result of the access transistor, approximately equivalent to applying a voltage to the source of an individual cell as described above. The basic bias conditions are completely established by applying voltage VS to the well.

The preferred voltages depend on the particular technology used to form the array. With 0.6 micron technology, voltage VD is preferably 4–7 volts greater than voltage VS. In addition, voltage VS is preferably ground. When smaller micron technologies are utilized, the preferred conditions can be reduced accordingly. Thus, for example, with 0.3 micron technology, voltage VD is preferably 2–4 volts greater than voltage VS.

The column of cells to be programmed is selected by applying a voltage VA to the access lines AC that contact the access transistors 114 that are in the adjacent column, i.e., column B. The remaining access lines AC are held at ground. For example, as shown in FIG. 2, the cells 112 in column A are selected by applying voltage VA to access lines AC1 and AC4, while access lines AC2 and AC3 are held at ground. Since voltage VA is used to turn on the appropriate access transistors 114, any voltage which turns on the transistors can be used.

Programming is accomplished by selecting a programming voltage VG from three or more programming voltages VG1–VGs for each cell to be programmed where the three or more programming voltages correspond to three or more threshold voltages, and by applying the programming voltages VG1–VGs to the word lines WL that correspond to the cells 112 to be programmed for a predetermined time.

For example, if cells A1, A2, and At are to be programmed with voltages VG1, VG2, and VGs, respectively, voltages VG1, VG2, and VGs are simultaneously applied to word lines WL1, WL2, and WLn, respectively.

The preferred voltages for programming voltages VG1–VGs depend on the number of logic levels to be programmed and generally fall within 0–5 volts. Although negative voltages can also be used, these voltages are not as desirable because of the additional circuitry needed to generate negative voltages.

In contrast to conventional programming, where the current flowing through a cell is approximately 400 mA, the current flowing through a cell during programming under the present invention is approximately 10 μA. As a result, as shown in FIG. 2, cells A1–At, or any combination thereof in column A of segment SG1, can be programmed at the same time to each have any one of the three or more logic levels by applying the corresponding programming voltages VG1–VGs to corresponding word lines WL1–WLn.

As further shown in FIG. 2, all of the access lines AC1–AC4 and word lines WL1–WLn in the remaining segments SG are held at ground. However, the same column in multiple segments can also be programmed at the same time.

One of the principle advantages of being able to program an entire column at the same time is that each cell in an entire segment can be programmed to store multiple bits of data in less time than is required for each cell to be conventionally programmed to store one bit of data. For example, in a segment that is eight bits wide by 32 bytes long, it takes one programming cycle to conventionally program each cell in a segment for a total of 256 (8×32) programming cycles.

On the other hand, since an entire column can be programmed at the same time, only eight programming cycles are required to program a segment in accordance with the present invention. Thus, in applications where an entire segment is frequently rewritten, the present invention provides a faster overall programming speed than is conventionally available.

Figure 8:
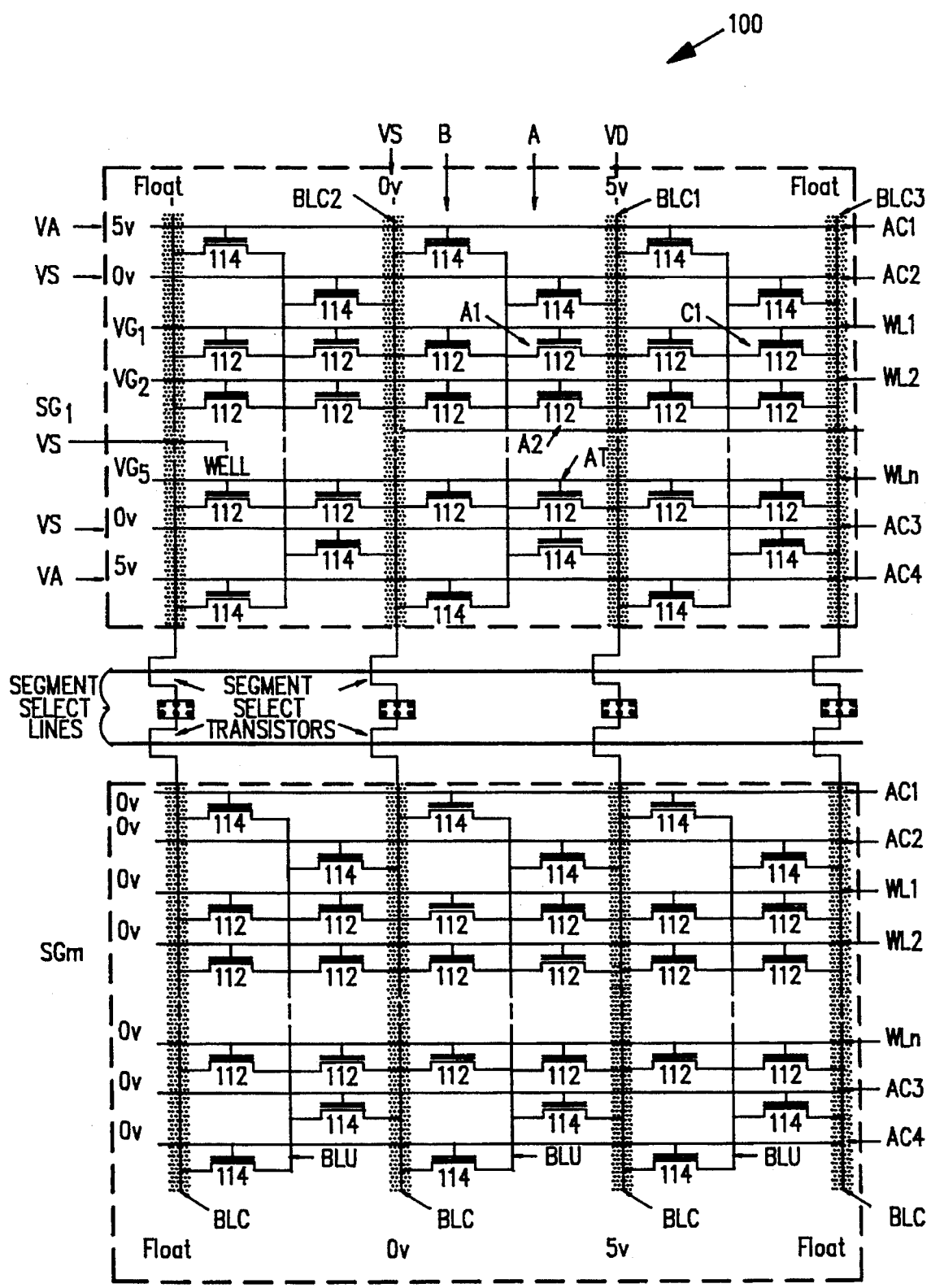
FIG. 8 is a plan view illustrating segment select transistors in a portion of an alternate-metal virtual-ground (AMG) array 100 in accordance with the present invention.

In the array illustrated in FIG. 2, the entire array is formed in a single well. In an alternative embodiment, each segment SG of array 100 can be formed in a separate well. Further, as shown in FIG. 8, whether formed in a single well or separate wells, each segment can be individually accessed via segment select transistors.

As a result, each segment SG can be operated on independently. Thus, for example, one column in segment SG1 can be programmed at the same time that a separate column in segment SG2 is being programmed which both can occur at the same time that a row of data is being read from segment SG3.

As stated above, only approximately 10 μA is required to program a single cell. As a result, multiple cells in a single row can be programmed at the same time if the cells are being programmed to the same logic level.

As shown in FIG. 2, cell C1 can not be conventionally programmed at the same time that cell A1 is being programmed due to the high programming currents that are required, i.e., 400 mA. In the present invention, however, cells A1 and C1 can be programmed at the same time, if both cells are being programmed to the same logic level, by also grounding bit line BLC3.

As stated above, one advantage of the present invention is that the memory cells 112 of array 100 can be programmed to store multiple levels by utilizing a programming voltage that is considerably less than the programming voltage typically used, i.e., less than five volts in the present invention compared to the approximately 12 volts that are typically used. In addition to providing a substantial power savings for low power applications, such as notebook computers, the present invention eliminates the need to form charge pumps on memory chips to produce the programming voltage, i.e., the 12 volts.

As is well known, charge pumps can consume a significant area, i.e., up to 30% of the total die area of a memory chip. Thus, by eliminating the need for charge pumps, the present invention significantly reduces the area required for a memory cell, and therefore the cost of a memory.

The elimination of high programming voltages also leads to an increase in the density of array 100 because less isolation is required between both memory cells and the peripheral circuitry. As a result, the present invention substantially reduces the size of array 100.

In another embodiment of the present invention, array 100 can be configured to support both conventional as well as multilevel programming by utilizing a high programming voltage. In this embodiment, the high programming voltage can be provided either externally or on-chip, i.e., via the charge pumps.

As a result, a single memory chip can utilize a first portion of the array to store one bit per cell when the data must be stored quickly, and a second portion of the array to store multiple bits per cell when more time can be taken to store the data.

It should be understood that various alternatives to the embodiment of the invention described herein may be employed in practicing the invention. For example, although the present invention has been described in terms of an n-channel, floating-gate memory cell formed in a p-well, the present invention equally applies to a p-channel, floating-gate memory cell formed in an n-well.

Thus, it is intended that the following claims define the scope of the invention and that methods and structures within the scope of these claims and their equivalents be covered thereby.

What is claimed is:

1. A method for simultaneously programming any combination of memory cells in a column of an alternate-metal virtual-ground (AMG) electrically-programmable read-only-memory (EPROM) or flash memory array to each store one of three or more threshold voltages, the array having a plurality of metal contacted bit lines, a plurality of non-contacted bit lines formed so that one non-contacted bit line is formed between each adjacent pair of metal contacted bit lines, a plurality of memory cells formed in columns and rows so that each column of memory cells is formed between and contacts adjacent pairs of metal contacted and non-contacted bit lines, a plurality of access transistors formed in a plurality of rows so that an access transistor is formed in each column of memory cells, each row of access transistors being formed so that one access transistor is formed between and contacts every other pair of metal contacted and non-contacted bit lines, a plurality of access lines formed so that each row of access transistors is contacted by a corresponding access line, and a plurality of word lines formed so that each row of memory cells is contacted by a corresponding word line, each cell being formed to produce a punchthrough current during programming, the array being formed in a well, the method comprising the steps of:

selecting a programming voltage from three or more programming voltages for each of a plurality of cells to be programmed in a column, each cell to be programmed having a corresponding word line, the three or more programming voltages corresponding to said three or more threshold voltages;

applying a first voltage to a first metal contacted bit line, the first metal contacted bit line contacting each memory cell and each access transistor in a first column of a pair of adjacent columns, the first column including the cells to be programmed;

applying a second voltage to a second metal contacted bit line, the second voltage being less than the first voltage, the second metal contacted bit line contacting each memory cell and access transistor in a second column of the pair of adjacent columns;

applying the second voltage to the well;

applying a third voltage to an access line of the plurality of access lines, the access line contacting the access transistor located in the second column of the pair of adjacent columns; and applying the programming voltages selected for the cells to be programmed to the word lines that correspond to the cells to be programmed.

2. The method of claim 1 wherein the second voltage is equal to ground.

3. The method of claim 1 wherein the second voltage is equal to the third voltage.

4. The method of claim 1 wherein the second voltage is less than the first voltage by a difference voltage within the range of two to seven volts.

5. A method for simultaneously programming any combination of memory cells in a column of a plurality of segments of an alternate-metal virtual-ground (AMG) electrically-programmable read-only-memory (EPROM) or flash memory array to each store one of three or more threshold voltages, at least two of the segments having a plurality of metal contacted bit lines, a plurality of non-contacted bit lines formed so that one non-contacted bit line is formed between each adjacent pair of metal contacted bit lines, a plurality of memory cells formed in columns and rows so that each column of memory cells is formed between and contacts adjacent pairs of metal contacted and non-contacted bit lines, a plurality of access transistors formed in a plurality of rows so that an access transistor is formed in each column of memory cells, each row of access transistors being formed so that one access transistor is formed between and contacts every other pair of metal contacted and non-contacted bit lines, a plurality of access lines formed so that each row of access transistors is contacted by a corresponding access line, and a plurality of word lines formed so that each row of memory cells is contacted by a corresponding word line, each cell being formed to produce a punchthrough current during programming, at least two of the segments being formed in a different well, the method comprising the steps of:

selecting a programming voltage from three or more programming voltages for each of a plurality of cells to be programmed in a column of each segment to be programmed, each cell to be programmed having a corresponding word line, the three or more programming voltages corresponding to said three or more threshold voltages;

applying a first voltage to a first metal contacted bit line in each segment to be programmed, the first metal contacted bit line contacting each memory cell and each access transistor in a first column of a pair of adjacent columns, the first column including the cells to be programmed;

applying a second voltage to a second metal contacted bit line in each segment to be programmed, the second voltage being less than the first voltage, the second metal contacted bit line contacting each memory cell and access transistor in a second column of the pair of adjacent columns;

applying the second voltage to the well in each segment to be programmed;

applying a third voltage to an access line of the plurality of access lines in each segment to be programmed, the access line contacting the access transistor located in the second column of the pair of adjacent columns; and applying the programming voltages selected for the cells to be programmed to the word lines that correspond to the cells to be programmed in each segment to be programmed.

6. A method for simultaneously programming multiple memory cells in a row of an alternate-metal virtual-ground (AMG) electrically-programmable read-only-memory (EPROM) or flash memory array to each store one of three or more threshold voltages, the array having a plurality of metal contacted bit lines, a plurality of non-contacted bit lines formed so that one non-contacted bit line is formed between each adjacent pair of metal contacted bit lines, a plurality of memory cells formed in columns and rows so that each column of memory cells is formed between and contacts adjacent pairs of metal contacted and non-contacted bit lines, a plurality of access transistors formed in columns and rows so that one access transistor is formed at each end of each column of memory cells, each row of access transistors being formed so that one access transistor is formed between and contacts every other pair of metal contacted and non-contacted bit lines, a plurality of access lines formed so that each row of access transistors is contacted by a corresponding access line, and a plurality of word lines formed so that each row of memory cells is contacted by a corresponding word line, each cell being formed to produce a punchthrough current during programming, the array being formed in a well, the method comprising the steps of:

selecting a programming voltage from three or more programming voltages for the memory cells to be programmed, the cells to be programmed having a corresponding word line, the three or more programming voltages corresponding to said three or more threshold voltages;

applying a first voltage to a first metal contacted bit line, the first metal contacted bit line contacting each memory cell and each access transistor in a first column of a pair of adjacent columns, the first column including one of the cells to be programmed;

applying a second voltage to a second metal contacted bit line, the second voltage being less than the first voltage, the second metal contacted bit line contacting each memory cell and access transistor in a second column of the pair of adjacent columns;

applying the second voltage to a third metal contacted bit line, the third metal contacted bit line contacting each memory cell and access transistor in a third column one column removed from the first column;

applying the second voltage to the well;

applying a third voltage to a pair of access lines, each access line of said pair of access lines contacting an access transistor located in the second column of the pair of adjacent columns, and a fourth column positioned between the first and third columns; and applying the programming voltage selected for the cells to be programmed to the word line that correspond to the cells to be programmed.

* * * * *